(12) United States Patent
Takahashi et al.

(10) Patent No.: US 9,129,667 B2
(45) Date of Patent: Sep. 8, 2015

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Yasuyuki Takahashi, Miyagi (JP); Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 164 days.

(21) Appl. No.: 13/900,140

(22) Filed: May 22, 2013

(65) Prior Publication Data

US 2013/0315011 A1 Nov. 28, 2013

(30) Foreign Application Priority Data

May 25, 2012 (JP) .................................. 2012-119314

(51) Int. Cl.
*G11C 7/00* (2006.01)
*G11C 7/22* (2006.01)
*G11C 11/00* (2006.01)

(52) U.S. Cl.
CPC ................ *G11C 7/22* (2013.01); *G11C 11/005* (2013.01)

(58) Field of Classification Search
USPC .................................................. 365/189.011
See application file for complete search history.

(56) References Cited

U.S. PATENT DOCUMENTS

| 5,731,856 | A | | 3/1998 | Kim et al. |
| 5,744,864 | A | | 4/1998 | Cillessen et al. |
| 5,901,301 | A | * | 5/1999 | Matsuo et al. ................ 712/212 |
| 6,118,306 | A | * | 9/2000 | Orton et al. ..................... 327/44 |
| 6,127,702 | A | | 10/2000 | Yamazaki et al. |
| 6,294,274 | B1 | | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Hoai V Ho
*Assistant Examiner* — Pablo Huerta
(74) *Attorney, Agent, or Firm* — Fish & Richardson P.C.

(57) ABSTRACT

A semiconductor device in which a nonvolatile memory can normally operate and power saving can be performed with a P-state function, and a driving method of the semiconductor device are provided. The semiconductor device includes: a first circuit configured to control a state including a driving voltage and a clock frequency of a processor core; a first memory circuit and a second memory circuit which store state data; a second circuit generating a power supply voltage and a third circuit generating a clock which are electrically connected to the first circuit; and the processor core electrically connected to the second circuit and the third circuit through a switch. The processor cores includes: a volatile memory; and a nonvolatile memory transmitting and receiving data to/from the first memory.

20 Claims, 12 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 6,785,829 B1 * | 8/2004 | George et al. | 713/320 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,604,852 B1 * | 12/2013 | Turullols et al. | 327/159 |
| 2001/0003206 A1 * | 6/2001 | Pole et al. | 713/320 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0088487 A1 * | 5/2004 | Barroso et al. | 711/122 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0026353 A1 * | 2/2006 | Lesot et al. | 711/118 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0307240 A1 * | 12/2008 | Dahan et al. | 713/320 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0122008 A1 * | 5/2010 | Goss et al. | 710/264 |
| 2010/0148171 A1 | 6/2010 | Hayashi et al. | |
| 2011/0089419 A1 * | 4/2011 | Yamazaki et al. | 257/43 |
| 2011/0145459 A1 * | 6/2011 | Conti et al. | 710/261 |
| 2012/0079174 A1 * | 3/2012 | Nellans et al. | 711/103 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m>4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 208, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW'08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for sub-1 V Supply DRAMs ," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of SOL-GEL-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

(56) References Cited

OTHER PUBLICATIONS

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner

SEMICONDUCTOR DEVICE AND DRIVING METHOD THEREOF

BACKGROUND OF THE INVENTION

1. Field of the Invention

The present invention relates to a semiconductor device and a driving method thereof.

2. Description of the Related Art

A semiconductor device such as a processor includes a signal processing circuit having a variety of structures. A signal processing circuit generally includes a variety of memory devices such as a register and a cache memory. A register has a function of temporarily holding data for carrying out arithmetic processing, holding a program execution state, or the like. In addition, a cache memory is located between an arithmetic circuit and a low-speed main memory in order to reduce access to the main memory and speed up the arithmetic processing.

In a memory device such as a register or a cache memory, reading and writing of data needs to be performed at higher speed than in a main memory. Thus, in general, a flip-flop or the like is used as a register, and a static random access memory (SRAM) or the like is used as a cache memory. Such a register, a cache memory, and the like are volatile memory devices in which data is lost when supply of power supply potential is stopped.

In order to reduce power consumption, a method for temporarily stopping supply of power supply voltage to a signal processing circuit in a period during which data is not input or output has been suggested. For example, Patent Document 1 discloses a method in which data in a volatile memory device such as a register or a cache memory is stored in a nonvolatile memory device formed in the periphery of the volatile memory device so that data can be held also in a period during which supply of power supply potential is stopped.

REFERENCE

Patent Document

[Patent Document 1] Japanese Published Patent Application No. H10-078836

SUMMARY OF THE INVENTION

As a measure to reduce power consumption of a processor, there is a function called a performance state (P-state) in which driving voltage or frequency condition is changed depending on the scale of processing. In general, the driving voltage and frequency are raised in the case where high-speed processing is necessary, and are lowered in the case where high-speed processing is unnecessary so that power consumption can be reduced.

A combination of power saving with this P-state function and power saving utilizing the above nonvolatile memory can lead to a further reduction in power consumption. However, a change of driving voltage or frequency with a P-state function causes a malfunction in writing or reading data to/from the nonvolatile memory in some cases. For example, data cannot be normally written to the nonvolatile memory in the case where the driving voltage is low or the frequency is high.

In view of this, an object of one embodiment of the present invention is to provide a semiconductor device in which a nonvolatile memory can normally operate and power saving can be performed with a P-state function. Another object is to provide a driving method of the semiconductor device.

One embodiment of the present invention relates to a semiconductor device which includes a memory functioning as a nonvolatile memory and in which the memory can normally operate even in the state where a P-state function is utilized.

One embodiment of the present invention is a semiconductor device including: a first circuit configured to control a state including a driving voltage and a clock frequency of a processor core; a first memory circuit and a second memory circuit which store state data; a second circuit generating a power supply voltage and a third circuit generating a clock which are electrically connected to the first circuit; and the processor core electrically connected to the second circuit and the third circuit through a switch. The processor cores includes: a first memory; and a second memory transmitting and receiving data to/from the first memory.

In this specification and the like, ordinal numbers such as "first" and "second" are used in order to avoid confusion among components, and the terms do not limit the components numerically.

State data including a driving voltage and a clock frequency supplied to the processor core can be stored in the first memory circuit.

State data including a driving voltage and a clock frequency supplied to the processor core before the first circuit receives an instruction for an off operation can be stored in the second memory circuit.

The first circuit, the switch, and the processor core may be electrically connected to a power gating circuit.

The semiconductor device may include a plurality of the processor cores, a plurality of the first circuits, a plurality of the second circuits, and a plurality of the switches.

The second memory preferably includes a transistor in which a channel formation region includes an oxide semiconductor.

Another embodiment of the present invention is a driving method of a semiconductor device, including the steps of: operating a processor core with a first state; performing an off operation; and performing an on operation. The off operation includes the steps of: keeping the first state or changing the first state into a second state; reading data from a first memory in the processor core; writing the data to a second memory in the processor core; and turning off the processor core. The on operation includes the steps of: keeping a state in the off operation or changing the state in the off operation into a third state; turning on the processor core; reading the data from the second memory; writing the data to the first memory; and changing the state in the off operation or the third state into the first state.

The off operation may further include the step of determining whether the first state is kept or is changed into the second state.

The on operation may further include the step of determining whether the state in the off operation is kept or changed into the third state.

The first state includes a driving voltage and a clock frequency supplied during an operation of the processor core before an instruction for the off operation is given.

The second state includes a driving voltage and a clock frequency at which the data is normally written to the second memory in the processor core.

The third state includes a driving voltage and a clock frequency at which the data is normally read from the second memory in the processor core.

Another embodiment of the present invention is a driving method of a semiconductor device, including the steps of: storing first state data including a driving voltage and a clock frequency supplied to a processor core in a first memory device; performing an off operation; and performing an on operation. In the off operation, a first circuit configured to a state receives an instruction for the off operation, the first state data is stored in a second memory device, the first state data stored in the first memory device is rewritten into second state data, the driving voltage and the clock frequency of the processor core are changed in accordance with the second state data, the first circuit requests an instruction for the off operation from a power gating circuit, data stored in a first memory in the processor core is read, the data is written to a second memory in the processor core, and electrical connection between the processor core and each of a second circuit generating a power supply voltage and a third circuit generating a clock is broken. In the off operation, the first circuit receives an instruction for the on operation, the second state data stored in the first memory device is rewritten into third state data, the driving voltage and the clock frequency of the processor core are changed in accordance with the third state data, the first circuit requests an instruction for the on operation from the power gating circuit, the processor core and each of the second circuit and the third circuit are reconnected, the data stored in the second memory is read, the data is written to the first memory, the third state data stored in the first memory device is rewritten into the first state data stored in the second memory device, and the driving voltage and the clock frequency of the processor core are changed in accordance with the first state data.

Another embodiment of the present invention is a driving method of a semiconductor device, including the steps of: storing first state data including a driving voltage and a clock frequency supplied to a processor core in a first memory device; performing an off operation; and performing an on operation. In the off operation, a first circuit configured to control a state receives an instruction for the off operation, the first state data is stored in a second memory device, and the first circuit reads the first state data from the first memory device and determines whether data stored in a first memory in the processor core is normally written to a second memory in the processor core with the first state. When the data is normally written to the second memory, the first circuit requests an instruction for the off operation from a power gating circuit, the data stored in the first memory is read, the data is written to the second memory, and electrical connection between the processor core and each of a second circuit generating a power supply voltage and a third circuit generating a clock is broken. When the data is not normally written to the second memory, the first state data stored in the first memory device is rewritten into second state data, the driving voltage and the clock frequency of the processor core are changed in accordance with the second state data, the first circuit requests the instruction for the off operation from the power gating circuit, the data stored in the first memory is read, the data is written to the second memory, and electrical connection between the processor core and each of the second circuit generating the power supply voltage and the third circuit generating the clock is broken. In the on operation, the first circuit receives an instruction for the on operation, and the first circuit reads the first state data or the second state data stored in the first memory device and determines whether the data is normally read from the second memory in the processor core with the first state data or the second state data. When the data is normally read from the second memory, the first circuit requests an instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data. When the data is not normally read from the second memory, the first state data or the second state data stored in the first memory device is rewritten into third state data, the driving voltage and the clock frequency of the processor core are changed in accordance with the third state data, the first circuit requests the instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data.

The third state data includes data on a driving voltage and a clock frequency at which the data is normally read from the second memory in the processor core.

Another embodiment of the present invention is a driving method of a semiconductor device, including the steps of: storing first state data including a driving voltage and a clock frequency supplied to a processor core in a first memory device; performing an off operation; and performing an on operation. In the off operation, a first circuit configured to control a state receives an instruction for the off operation, the first state data is stored in a second memory device, and the first circuit reads the first state data from the first memory device and determines whether data stored in a first memory in the processor core is normally written to a second memory in the processor core with the first state. When the data is normally written to the second memory, the first circuit requests an instruction for the off operation from a power gating circuit, the data stored in the first memory is read, the data is written to the second memory, and electrical connection between the processor core and each of a second circuit generating a power supply voltage and a third circuit generating a clock is broken. When the data is not normally written to the second memory, the first state data stored in the first memory device is rewritten into second state data, the driving voltage and the clock frequency of the processor core are changed in accordance with the second state data, the first circuit requests the instruction for the off operation from the power gating circuit, the data stored in the first memory is read, the data is written to the second memory, and electrical connection between the processor core and each of the second circuit generating the power supply voltage and the third circuit generating the clock is broken. In the on operation, the first circuit receives an instruction for the on operation, the first circuit requests an instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data.

The first state data includes data on a driving voltage and a clock frequency supplied during an operation of the processor core before the first circuit receives the instruction for the off operation.

The second state data includes data on a driving voltage and a clock frequency at which the data is normally written to the second memory in the processor core.

In the off operation or the on operation in the driving method of the semiconductor device of any of the embodiments, a measure to select the processor core may be included.

According to one embodiment of the present invention, in a semiconductor device which includes a memory functioning as a nonvolatile memory, the memory can normally operate even in the state where a P-state function is utilized. Further, the semiconductor device including the memory is made to operate in the state where the P-state function is utilized, whereby power consumption of the semiconductor device can be reduced.

DETAILED DESCRIPTION OF THE INVENTION

Figure 1:
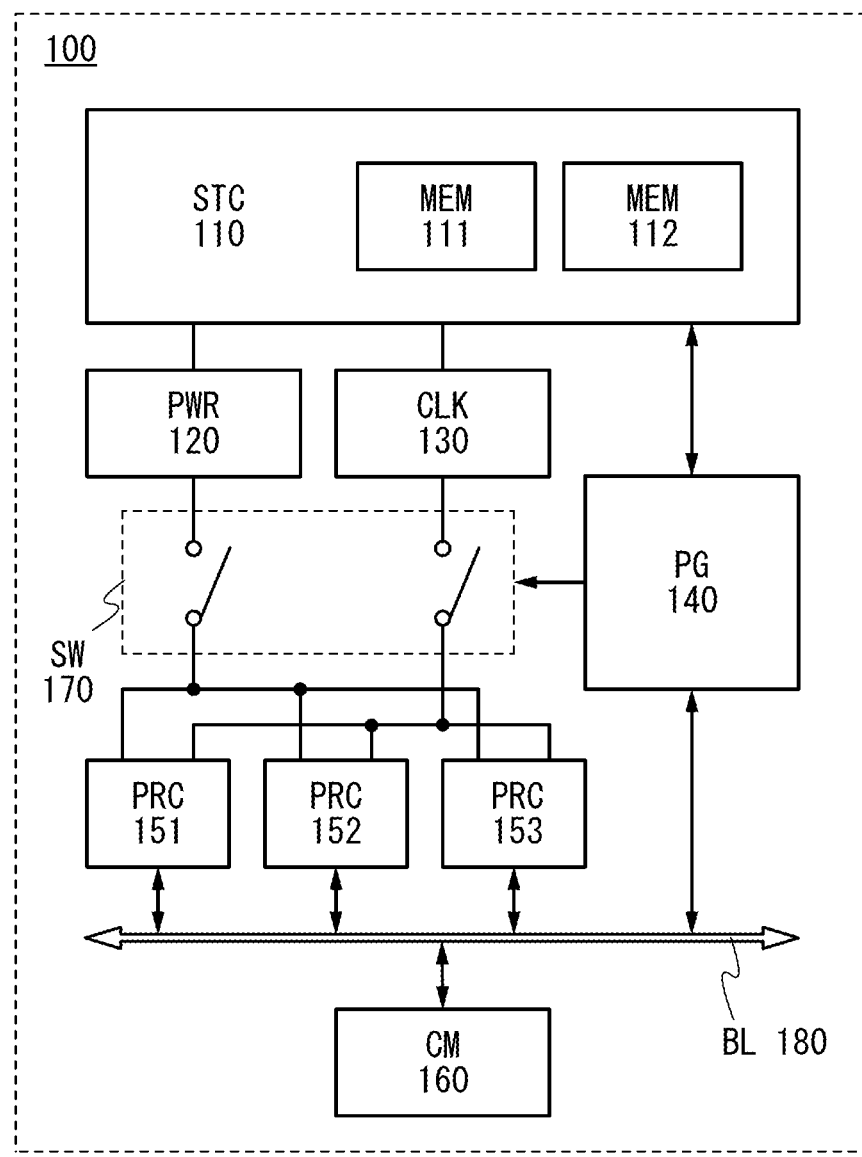
FIG. 1 is a block diagram illustrating a semiconductor device.

Hereinafter, embodiments of the present invention will be described in detail with reference to the accompanying drawings. Note that the present invention is not limited to the description below, and it is easily understood by those skilled in the art that modes and details disclosed herein can be modified in various ways without departing from the spirit and the scope of the present invention. Therefore, the present invention should not be construed as being limited to the description in the following embodiments. Note that in all drawings used to illustrate the embodiments, portions that are identical or portions having similar functions are denoted by the same reference numerals, and their repetitive description may be omitted.

The present invention includes in its category the following semiconductor devices including a memory device or the like: processors such as central processing units (CPUs), integrated circuits such as image processing circuits, digital signal processors (DSPs), field programmable gate arrays (FPGAs), and microcontrollers, RF tags, and semiconductor display devices.

Embodiment 1

In this embodiment, a structure and a driving method of a semiconductor device of one embodiment of the present invention will be described.

As a measure to reduce power consumption of a processor, there is a method in which data in a volatile memory device such as a register or a cache memory included in the processor is stored in a nonvolatile memory device formed in the periphery of the volatile memory device, and supply of power supply voltage to a signal processing circuit including the register or the cache memory is temporarily stopped. Since supply of the power supply voltage to the signal processing circuit is stopped in a period during which data is not input or output, power consumption can be reduced without a significant degradation of the processing capacity of the processor.

In this specification, the term "nonvolatile" means a property of retaining stored data even when power supply is stopped, and the term "volatile" means a property of erasing stored data immediately after power supply is stopped.

As the nonvolatile memory, for example, a memory element in which supply, retaining, and release of electric charge to/at/into a capacitor or a floating node are controlled using a transistor with extremely small off-state current, a memory element using a magnetic tunnel junction (MTJ) element, a memory element using a ferroelectric, a memory element using a resistance random access memory, or the like can be used.

As another measure to reduce power consumption of a processor, there is a function called a performance state (P-state) in which driving voltage or frequency condition is changed depending on the scale of processing. For the P-state, for example, symbols such as P0, P1, and P2 are used, and the symbol with a larger number means that the processor operates at a lower clock frequency and a lower power supply voltage. That is, the larger the numerical number of the P-state is, the lower the power consumption of the processor becomes. Note that in the case of a processor including a plurality of cores, the P-state is assigned to each core so that power consumption can be efficiently reduced.

When a processor is formed using the nonvolatile memory and made to operate with the P-state function, it is expected that power consumption thereof can be further reduced. However, a change of driving voltage or frequency with the P-state function causes a malfunction in writing or reading data to/from the nonvolatile memory in some cases.

For example, when a capacitor is used for a storage node M2 in the nonvolatile memory, writing sometimes cannot be normally performed with the P-state using a low power supply voltage in the case where the voltage at which "High" is written to (stored in) the capacitor is used as a power supply voltage. That is, the difference between "High" and "Low" cannot be distinguished in the case where writing is not performed with a predetermined voltage or more.

In reading data from the nonvolatile memory, when the difference between "High" and "Low" is distinguished using the potential of a node M1 in such a manner that the node M1 is pre-charged with a power supply voltage and then discharged in accordance with data written to the storage node M2, the following problem arises. For example, the difference between "High" and "Low" cannot be distinguished in the case where, after "High" is written to the storage node M2 with a P-state using a relatively low power supply voltage, the P-state is changed to a P-state using a relatively high power supply voltage. The reason for this is that the node M1 is pre-charged with high voltage in reading and thus cannot be sufficiently discharged.

The storage node M2 cannot be sufficiently charged with a P-state using high clock frequency depending on the performance of a switch (e.g., a transistor) controlling writing to the storage node M2 (how much the storage node M2 is charged), and thus normal writing cannot be performed in some cases.

That is, the power supply voltage and clock frequency of the nonvolatile memory need to be appropriate values for writing or reading, and thus measures against malfunction in writing or reading data to/from the nonvolatile memory need to be taken in the case where the P-state is changed. One embodiment of the present invention has been made in view of the above problems, and the detailed description is made below.

FIG. 1 is a block diagram illustrating an example of a semiconductor device of one embodiment of the present invention. A semiconductor device 100 includes a state control circuit 110 including a first memory device 111 and a second memory device 112, a power supply generation circuit 120, a clock generation circuit 130, a power gating circuit 140, processor cores 151, 152, and 153, and a cache memory 160. Note that there is no particular limitation on the number of processor cores. Although not illustrated, each processor core includes a register and a cache memory formed of a volatile memory, and a nonvolatile memory capable of transmitting and receiving data to/from the volatile memory. Note that a plurality of cache memories may be provided either inside or outside the processor core.

The state control circuit 110 is electrically connected to the power supply generation circuit 120 and the clock generation circuit 130, and controls the driving voltages (power supply voltages) and clock frequencies of the processor cores 151, 152, and 153. The state control circuit 110 is electrically connected to the power gating circuit 140 to transmit and receive state data including the power supply voltages and the clock frequencies supplied to the processor cores 151, 152, and 153. The state data can be stored in the first memory device 111 and the second memory device 112 in the state control circuit 110. Note that the first memory device 111 and the second memory device 112 may be provided outside the state control circuit 110.

The power supply generation circuit 120 and the clock generation circuit 130 are each electrically connected to the processor cores 151, 152, and 153 through a switch 170 to supply the power supply voltages and clocks to the processor cores 151, 152, and 153. The switch 170 is controlled by the power gating circuit 140. Note that a structure may be employed in which a plurality of power supply generation circuits 120, a plurality of clock generation circuits 130, and a plurality of switches 170 are provided so that the processor cores can be independently controlled to be turned on or off and can be independently supplied with a power supply voltage and a clock.

The processor cores 151, 152, and 153 are electrically connected to a bus line 180 to transmit and receive an instruction, an address, data, and the like to/from various peripheral devices such as the cache memory 160. Further, the processor cores 151, 152, and 153 are electrically connected to the power gating circuit 140 through the bus line 180, and thus power gating control can be performed for each processor core.

The semiconductor device 100 is not limited to the above, and may have a structure in which one or more circuits illustrated in FIG. 1 are omitted, a structure in which several circuits are combined, or a structure in which another circuit is added to the circuits illustrated in FIG. 1. Further, each circuit is not necessarily formed over one chip, and may be formed over a plurality of chips to be electrically connected to each other through a bus line, a signal line only for connecting them, or a power supply line. Further, a structure in which part of a circuit function is replaced with software may be employed.

Next, a driving method of the semiconductor device for solving the above problems will be described in detail. In order to solve the above problems, specifically, at the time of writing data to a nonvolatile memory, a P-state with which data can be normally written to the nonvolatile memory may be assigned. Further, at the time of reading data from the nonvolatile memory, a P-state with which data can be normally read from the nonvolatile memory may be assigned.

Figure 2:
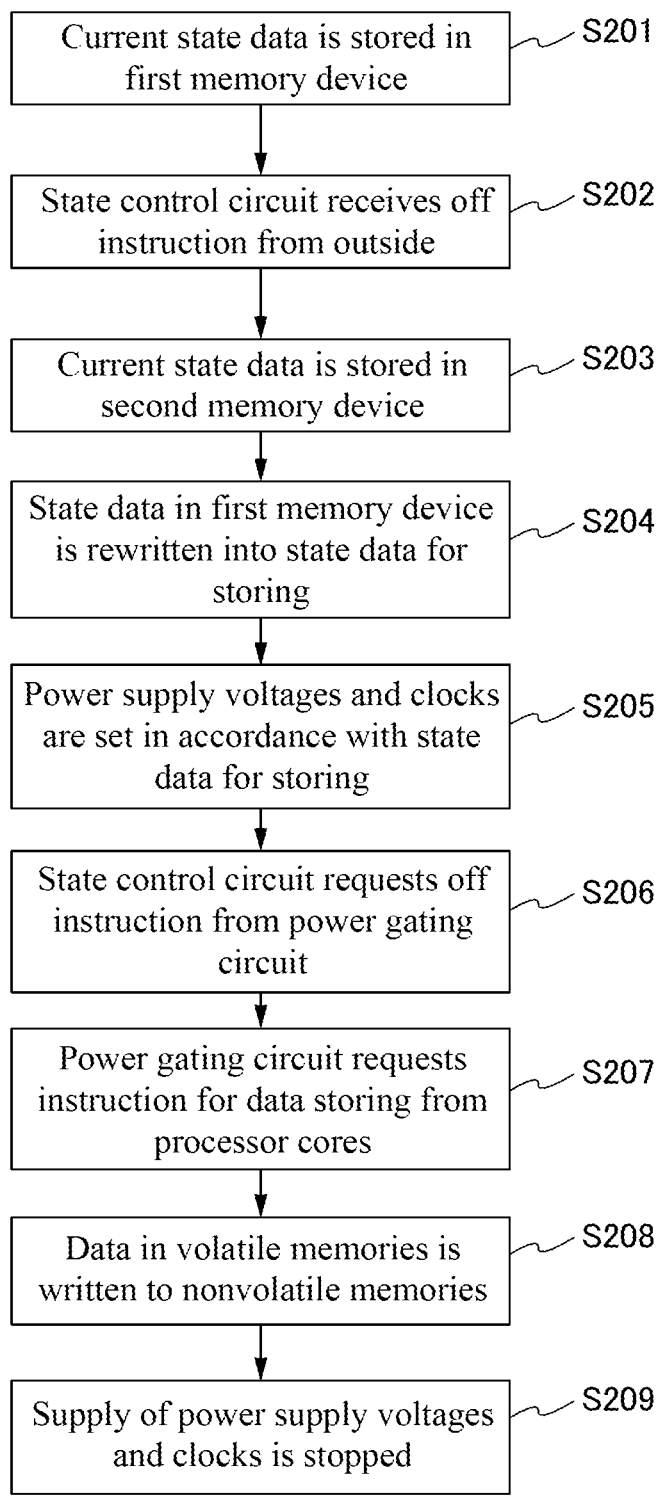
FIG. 2 is a flowchart showing operations of a semiconductor device.
Figure 3:
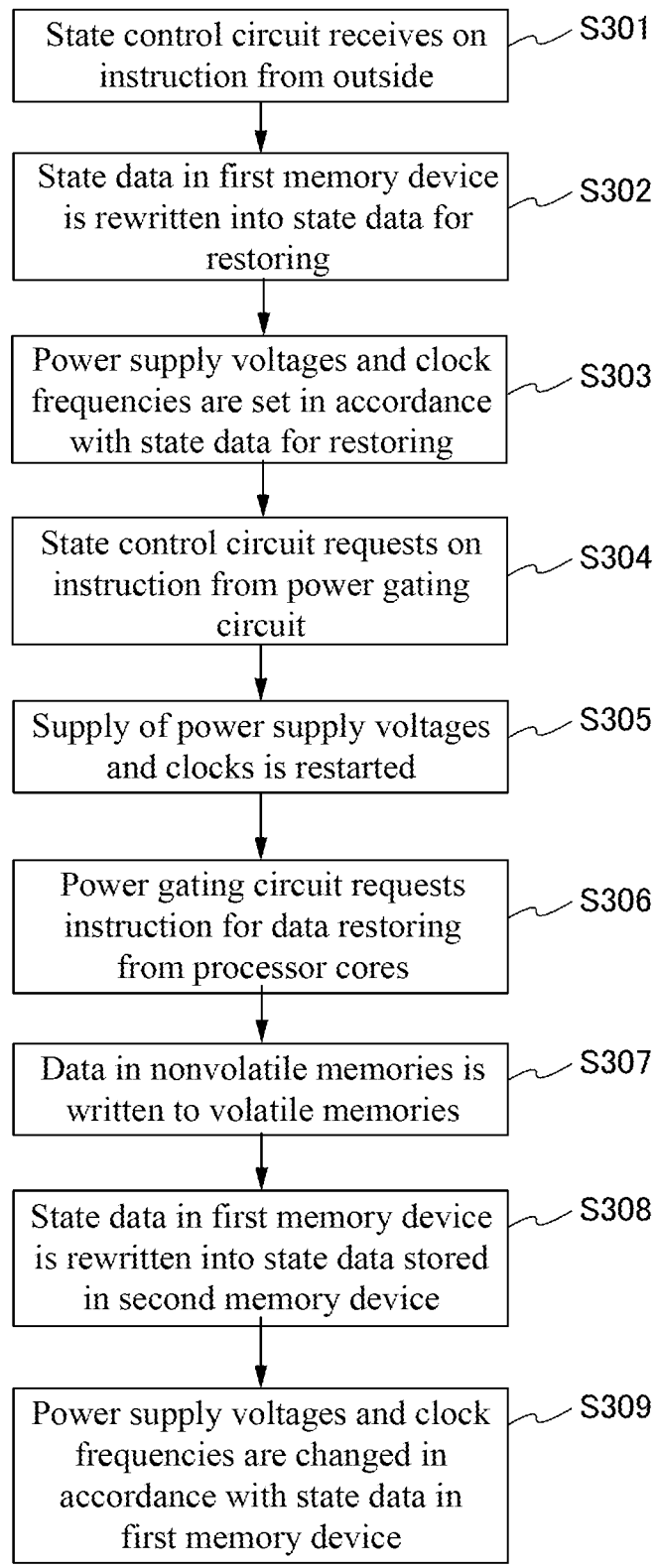
FIG. 3 is a flowchart showing operations of a semiconductor device.

FIG. 2 and FIG. 3 are flowcharts showing a first method for driving the semiconductor device 100 illustrated in FIG. 1.

First, the driving process for stopping power supply to the processor cores 151, 152, and 153 in the first method (off operation) is described with reference to the flowchart of FIG. 2. Every time the state control circuit 110 receives an instruction of a P-state (driving voltage and clock frequency) assigned to any of the processor cores 151, 152, and 153 from the outside, data on the P-state is stored as current state data in the first memory device 111 (S201). Then, the power supply generation circuit 120 and the clock generation circuit 130 generate power supply voltages and clocks, respectively, in accordance with the current state data, the switch 170 is turned on in response to the instruction from the power gating circuit 140, and the power supply voltages and the clocks are supplied to the processor cores 151, 152, and 153 in accordance with the current state data.

Next, the state control circuit 110 receives an instruction for the off operation (hereinafter, referred to as "off instruction") from the outside (S202), and then current state data is stored in the second memory device 112 (S203).

Then, the current state data stored in the first memory device 111 is rewritten into state data for storing (S204). Here, the state data for storing relates to power supply voltages and clock frequencies with which data can be normally written to the nonvolatile memories included in the processor cores 151, 152, and 153, and is data on values set in advance. For example, the power supply voltage and the clock frequency as the current state data are changed into a relatively high power supply voltage and a relatively low clock frequency as the state data for storing. Note that in the first method, the current state data is erased to be forcibly changed into the state data for storing.

Next, power supply voltages and clocks are generated in accordance with the state data for storing to be supplied to the processor cores 151, 152, and 153 (S205).

Then, the state control circuit 110 requests an off instruction from the power gating circuit 140 (S206), and the power gating circuit 140 requests an instruction for data storing from the processor cores 151, 152, and 153 (S207).

Here, data in processing in the volatile memories such as a register and a cache memory included in the processor cores 151, 152, and 153 is written to the nonvolatile memories included in the processor cores 151, 152, and 153 (S208). Since the state has been changed into the state for storing of the P-state, data can be normally written to the nonvolatile memories.

Then, the switch 170 is turned off in response to the instruction from the power gating circuit 140, and thus supply of power supply voltages and clocks to the processor cores 151, 152, and 153 is stopped (S209).

Next, the process for restarting power supply to the processor cores 151, 152, and 153 to which power supply has been stopped through the steps shown in the flowchart of FIG. 2 (on operation) is described with reference to the flowchart of FIG. 3.

First, the state control circuit 110 receives an instruction for the on operation (hereinafter, referred to as "on instruction") from the outside (S301), and then the state data for storing in the first memory device 111 is rewritten into state data for restoring (S302). Here, the state data for restoring relates to power supply voltages and clock frequencies with which data can be normally read from the nonvolatile memories included in the processor cores 151, 152, and 153, and is data on values set in advance. For example, the power supply voltage and the clock frequency as the state data for storing are changed into a power supply voltage equivalent to that in data storing and a clock frequency at which a reading error can be reduced as the state data for restoring.

Next, power supply voltages and clocks are generated in accordance with the state data for restoring to be supplied to the processor cores 151, 152, and 153 (S303).

Then, the state control circuit 110 requests an on instruction from the power gating circuit 140 (S304), and thus the switch 170 is turned on in response to the instruction from the power gating circuit 140. Accordingly, power supply voltages and clocks are supplied to the processor cores 151, 152, and 153.

Next, the power gating circuit 140 requests an instruction for data restoring from the processor cores 151, 152, and 153 (S306).

Here, data stored in the nonvolatile memories in the processor cores 151, 152, and 153 is read to be restored to the volatile memories such as a register and a cache memory in the processor cores 151, 152, and 153 (S307). Since the state has been changed into the state for restoring of the P-state, data can be normally read from the nonvolatile memories.

Then, the state data for restoring in the first memory device 111 is rewritten into state data stored in the second memory device 112 (S308). Here, the state data stored in the second memory device 112 relates to a state before the state control circuit 110 receives the off instruction.

Next, power supply voltages and clocks are generated in accordance with the state data stored in the first memory device 111 to be supplied to the processor cores 151, 152, and 153 (S309). Consequently, the processor cores 151, 152, and 153 can operate again with the same state as that before supply of the power supply voltages is stopped.

Figure 4:
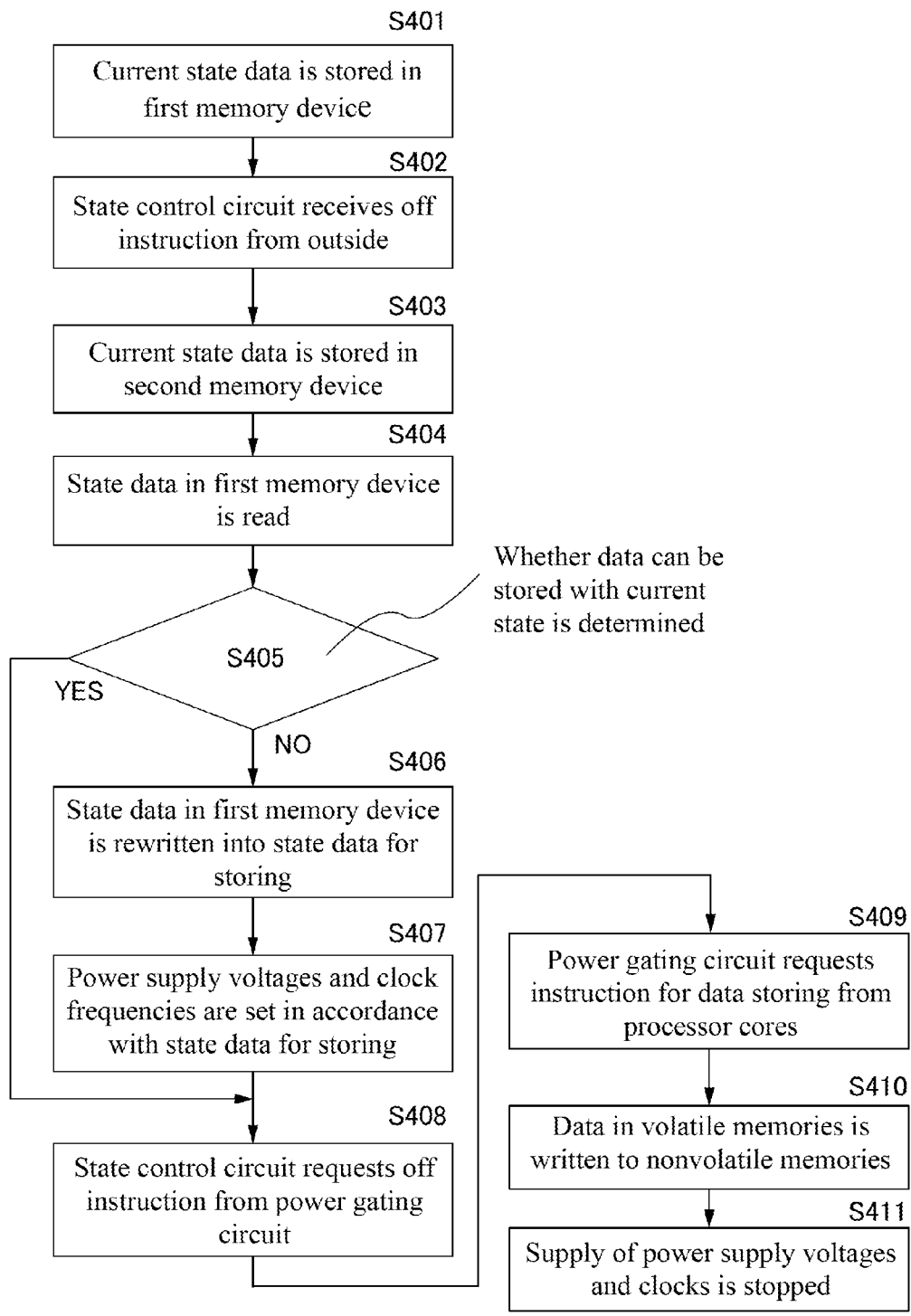
FIG. 4 is a flowchart showing operations of a semiconductor device.
Figure 5:
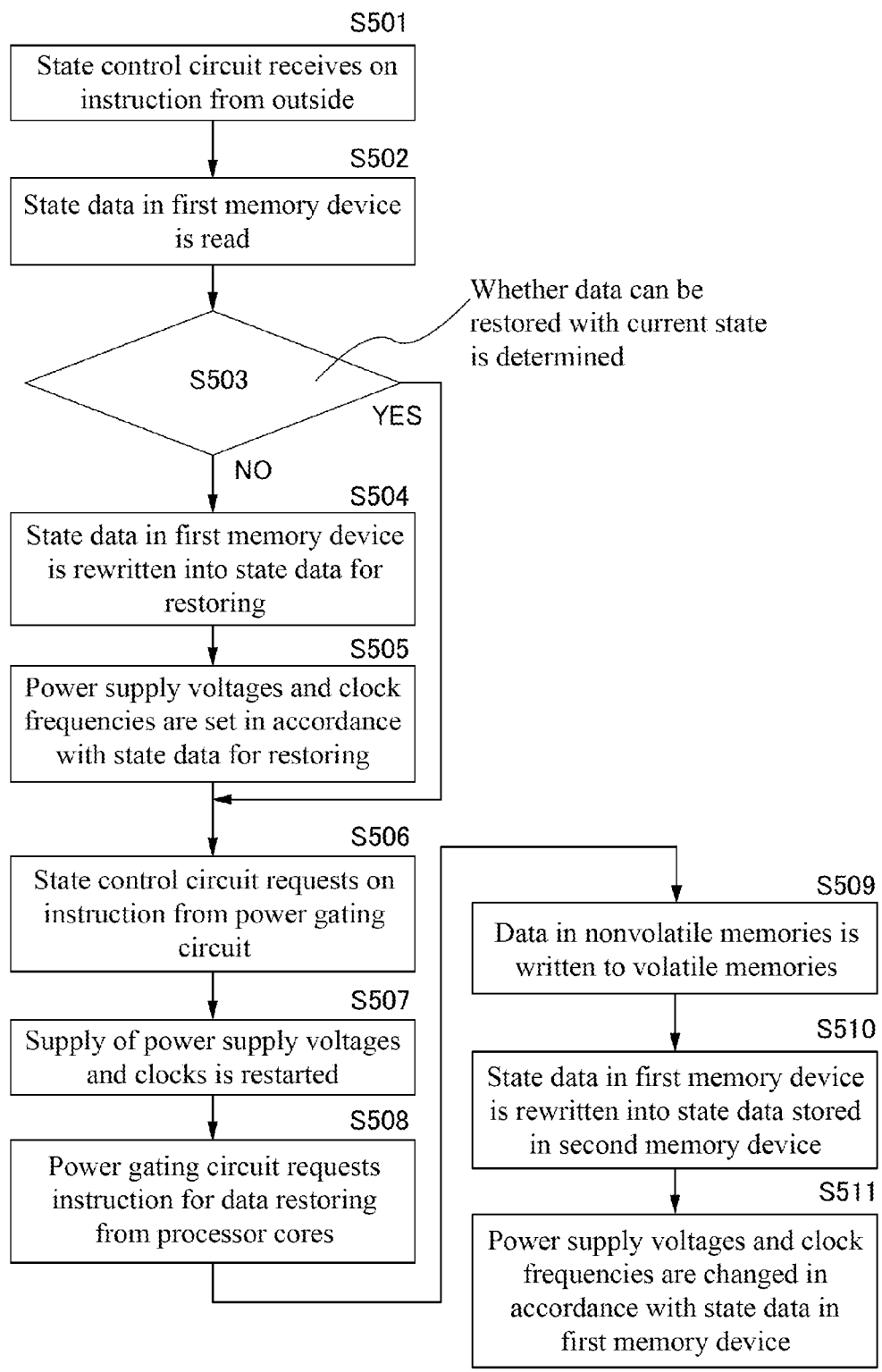
FIG. 5 is a flowchart showing operations of a semiconductor device.

Then, the process of driving the semiconductor device 100 illustrated in FIG. 1 by a second method will be described with reference to FIG. 4 and FIG. 5.

First, the driving process for stopping power supply to the processor cores 151, 152, and 153 in the second method (off operation) is described with reference to the flowchart of FIG. 4. Every time the state control circuit 110 receives an instruction of a P-state (driving voltage and clock frequency) assigned to any of the processor cores 151, 152, and 153 from the outside, data on the P-state is stored as current state data in the first memory device 111 (S401). Then, the power supply generation circuit 120 and the clock generation circuit 130 generate power supply voltages and clocks in accordance with the current state data, the switch 170 is turned on in response to the instruction from the power gating circuit 140, and the power supply voltages and the clocks are supplied to the processor cores 151, 152, and 153 in accordance with the current state data.

Next, the state control circuit 110 receives an off instruction from the outside (S402), and then current state data is stored in the second memory device 112 (S403).

Next, the state control circuit 110 reads current state data stored in the first memory device 111 (S404), and determines whether data in processing in the processor cores can be stored with a current state. Here, software may be used for reading of the state data and the determination as to whether data can be stored.

In the case where data can be stored with the current state, the state control circuit 110 requests an off instruction from the power gating circuit 140 (S408). Then, the power gating circuit 140 requests an instruction for data storing from the processor cores 151, 152, and 153 (S409).

Here, data in processing in the volatile memories such as a register and a cache memory included in the processor cores 151, 152, and 153 is written to the nonvolatile memories included in the processor cores 151, 152, and 153 (S410). At this time, since the P-state is a state where data can be stored, data can be normally written to the nonvolatile memories.

Then, the switch 170 is turned off in response to the instruction from the power gating circuit 140, and thus supply of power supply voltages and clocks to the processor cores 151, 152, and 153 is stopped (S411).

In the case where data cannot be stored with the current state, current state data stored in the first memory device 111 is rewritten into state data for storing (S406).

Next, power supply voltages and clocks are generated in accordance with the state data for storing to be supplied to the processor cores 151, 152, and 153 (S407). The subsequent steps are the same as those in the case where data can be stored with the current state.

Next, the process for restarting power supply to the processor cores 151, 152, and 153 to which power supply has been stopped through the steps shown in the flowchart of FIG. 4 (on operation) is described with reference to the flowchart of FIG. 5.

First, the state control circuit 110 receives an on instruction from the outside (S501), and then the state control circuit 110 reads state data stored in the first memory device 111 (S502) to determine whether data can be normally read from the nonvolatile memories in the processor cores 151, 152, and 153. Here, software may be used for reading of the state data and the determination as to whether data can be restored.

In the case where data can be stored with the state stored in the first memory device 111, the state control circuit 110 requests an on instruction from the power gating circuit 140 (S506). Then, the switch 170 is turned on in response to the instruction from the power gating circuit 140, and thus power supply voltages and clocks to the processor cores 151, 152, and 153 are supplied (S507).

Then, the power gating circuit 140 requests an instruction for data restoring from the processor cores 151, 152, and 153 (S508).

Here, data stored in the nonvolatile memories in the processor cores 151, 152, and 153 is read to be restored to the volatile memories such as a register and a cache memory in the processor cores 151, 152, and 153 (S509).

Then, the state data stored in the first memory device 111 is rewritten into state data stored in the second memory device 112 (S510). Here, the state data stored in the second memory device 112 relates to a state before the state control circuit 110 receives the off instruction.

Next, power supply voltages and clocks are generated in accordance with the state data stored in the first memory device 111 to be supplied to the processor cores 151, 152, and 153 (S511). Consequently, the processor cores 151, 152, and 153 can operate again with the same state as that before supply of the power supply voltages is stopped.

In the case where data cannot be restored with the state stored in the first memory device 111, the state data stored in the first memory device 111 is rewritten into state data for restoring (S504).

Then, power supply voltages and clocks are generated in accordance with the state data for restoring to be supplied to the processor cores 151, 152, and 153 (S505). The subsequent steps are the same as those in the case where data can be stored with the state stored in the first memory device 111.

Figure 6:
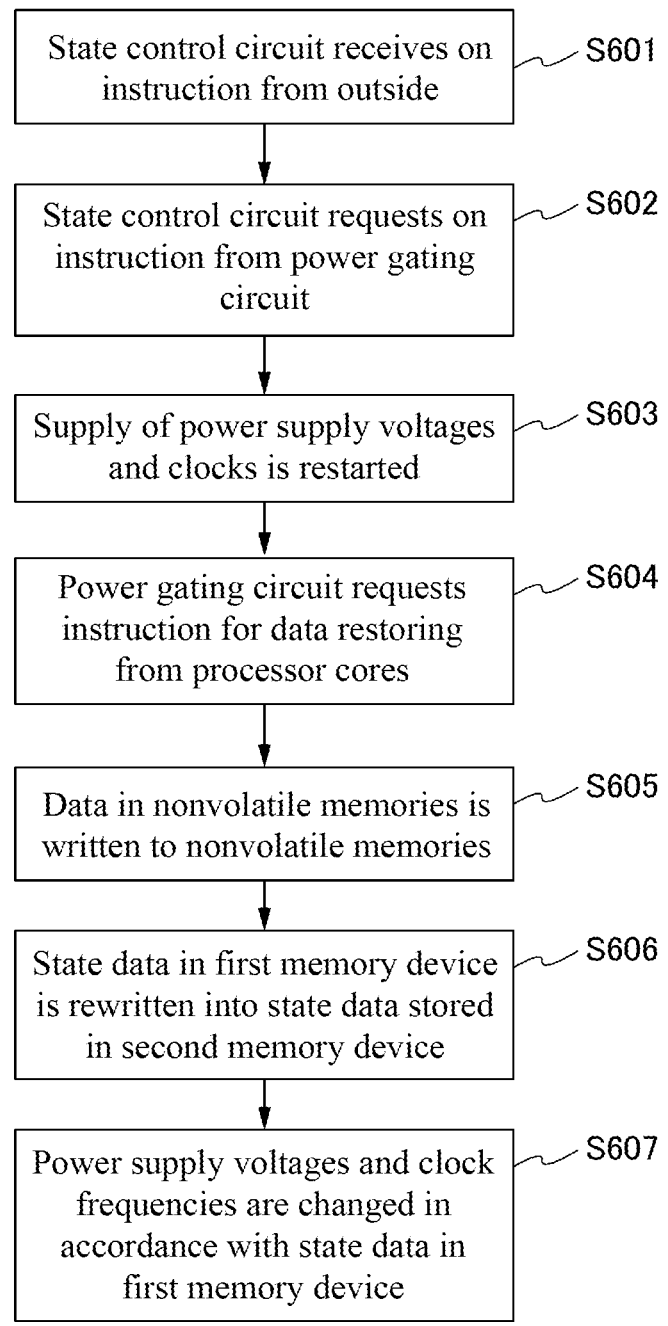
FIG. 6 is a flowchart showing operations of a semiconductor device.

Then, the process of driving the semiconductor device 100 illustrated in FIG. 1 by a third method will be described with reference to FIG. 6. Note that the process for stopping power supply to the processor cores 151, 152, and 153 (off operation) in the third method is the same as that in the second method. Next, the process for restarting power supply to the processor cores 151, 152, and 153 (on operation) to which power supply has been stopped through the steps shown in the flowchart of FIG. 4 is described with reference to the flowchart of FIG. 6.

First, the state control circuit 110 receives an on instruction from the outside (S601), and then the state control circuit 110 requests an on instruction from the power gating circuit 140 (S602). Then, the switch 170 is turned on in response to the instruction from the power gating circuit 140, and power supply voltages and clocks to the processor cores 151, 152, and 153 are supplied (S603).

That is, in the third method, whether data can be restored with the state at the time when power supply is stopped is not determined, and data is restored with the state at the time when power supply is stopped. For that reason, the state at the time when power supply is stopped is preferably a state with which data can also be restored.

Then, the power gating circuit 140 requests an instruction for data restoring from the processor cores 151, 152, and 153 (S604).

Here, data stored in the nonvolatile memories in the processor cores 151, 152, and 153 is read to be restored to the volatile memories such as a register and a cache memory in the processor cores 151, 152, and 153 (S605).

Then, the state data stored in the first memory device 111 is rewritten into state data stored in the second memory device 112 (S606). Here, the state data stored in the second memory device 112 relates to a state before the state control circuit 110 receives the off instruction.

Next, power supply voltages and clocks are generated in accordance with the state data stored in the first memory device 111 to be supplied to the processor cores 151, 152, and 153 (S607). Consequently, the processor cores 151, 152, and 153 can operate again with the same state as that before supply of the power supply voltages is stopped.

By the above driving method of a semiconductor device according to one embodiment of the present invention, a processor including a nonvolatile memory can be made to normally operate using a P-state function, and the semiconductor device can be driven with low power consumption.

This embodiment can be implemented in appropriate combination with any of the other embodiments.

Embodiment 2

In this embodiment, an example of a memory element including a nonvolatile memory, which can be used in the semiconductor device described in Embodiment 1, will be described.

Figure 7:
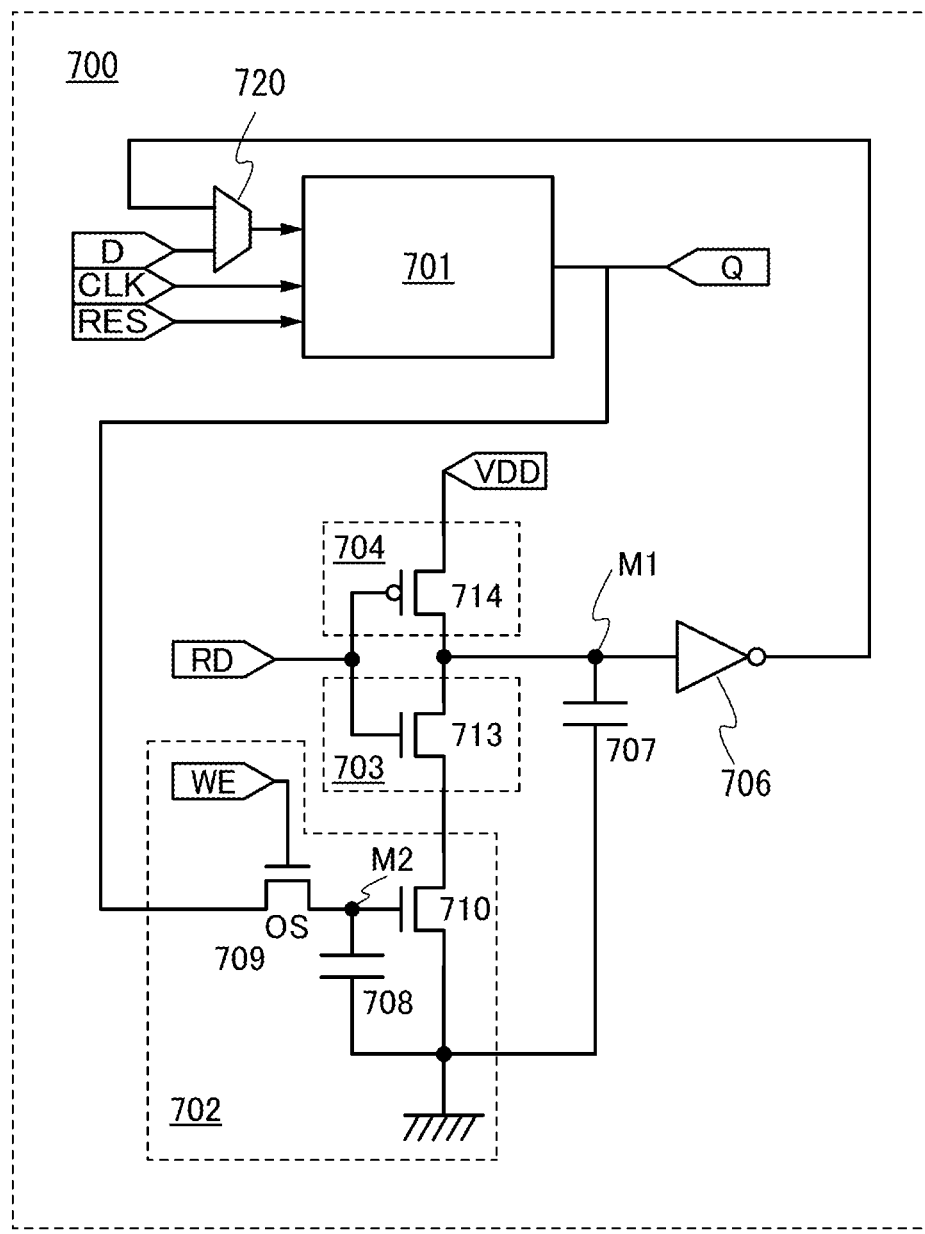
FIG. 7 is a circuit diagram illustrating a memory device.

FIG. 7 is an example of a circuit diagram of a memory element (register) including a nonvolatile memory. A memory element 700 includes a volatile memory circuit 701, a nonvolatile memory circuit 702, a switch 703, a switch 704, a logic element 706, a capacitor 707, and a selector circuit 720. The volatile memory circuit 701 holds data only in a period during which a power supply voltage is supplied. The nonvolatile memory circuit 702 includes a capacitor 708, a transistor 709, and a transistor 710.

Note that the memory element 700 may further include another circuit element such as a diode, a resistor, or an inductor, as needed.

The transistor 709 is a transistor in which a channel is formed in an oxide semiconductor layer. In FIG. 7, "OS" is written beside a transistor in order to indicate that the transistor 709 has a structure in which a channel is formed in an oxide semiconductor layer. Here, as the transistor 709 in which the channel is formed in the oxide semiconductor layer, an n-channel enhancement (normally-off) transistor whose leakage current (off-state current) is extremely small is used. When supply of the power supply voltage to the memory element 700 is stopped, a ground potential (0 V) or a potential at which the transistor 709 is turned off continues to be input to a gate of the transistor 709. For example, the gate of the transistor 709 is grounded through a load such as a resistor.

FIG. 7 illustrates an example in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a low potential power supply line (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a power supply line to which a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the low potential power supply line (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the low potential power supply line (e.g., a GND line).

The capacitor 707 and the capacitor 708 are not necessarily provided as long as the parasitic capacitance of the transistor, the wiring, or the like is actively utilized.

A control signal WE is input to the gate of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the volatile memory circuit 701 is input to the other of the source and the drain of the transistor 709. FIG. 7 illustrates an example in which a signal output from the volatile memory circuit 701 is input to the other of the source and the drain of the transistor 709. The logic value of a signal output from the second terminal of the switch 703 (the other of the source and the drain of the transistor 713) is inverted by the logic element 706, and the inverted signal is input to the volatile memory circuit 701 through the selector circuit 720.

In the example of FIG. 7, a signal output from the second terminal of the switch 703 (the other of the source and the drain of the transistor 713) is input to the volatile memory circuit 701 through the logic element 706 and the selector circuit 720; however, this embodiment is not limited thereto. The signal output from the second terminal of the switch 703 (the other of the source and the drain of the transistor 713) may be input to the volatile memory circuit 701 without its logic value being inverted. For example, in the case where a node in which a signal obtained by inversion of the logic value of a signal input from the input terminal is held is provided in the volatile memory circuit 701, the signal output from the second terminal of the switch 703 (the other of the source and the drain of the transistor 713) can be input to the node.

In FIG. 7, the transistor 709 can have two gate electrodes above and below an oxide semiconductor layer. The control signal WE can be input to one of the gates, and a control signal WE2 can be input to the other of the gates. The control signal WE2 may be a signal having a constant potential. The constant potential may be the ground potential GND or the power supply potential VDD. Note that the two gates provided above and below the oxide semiconductor layer may be electrically connected to each other and supplied with the control signal WE. The threshold voltage of the transistor 709 can be controlled by a signal input to the other of the gates of the transistor 709. For example, the off-state current of the transistor 709 can be further reduced.

In FIG. 7, a transistor in which a channel is formed in a layer or a substrate including a semiconductor other than an oxide semiconductor can be used for any of the transistors other than the transistor 709 among the transistors used for the memory element 700; for example, a transistor in which a channel is formed in a silicon layer or a silicon substrate can be used. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or a substrate including a semiconductor other than an oxide semiconductor can be used for the rest of the transistors.

As the volatile memory circuit 701 in FIG. 7, for example, a flip-flop circuit can be used. As the logic element 706, for example, an inverter, a clocked inverter, or the like can be used.

The above is the structure of the memory element 700. Next, a driving method of the memory element 700 will be described.

In the case where, in the memory element 700, the power supply voltage is supplied, stopped for a reduction in power consumption at the time of data holding, and then supplied again, the memory element 700 can be driven in the following manner. The driving method will be described with reference to a timing chart in FIG. 8. In the timing chart in FIG. 8, reference numeral 701 denotes data held in the volatile memory circuit 701, reference symbol WE denotes the potential of the control signal WE, reference symbol RD denotes the potential of the control signal RD, reference symbol SEL denotes the potential of the control signal SEL of one path in the selector circuit 720, and reference symbol VDD denotes the power supply potential VDD. Reference symbol M1 denotes the potential of the node M1, and reference symbol M2 denotes the potential of the node M2. Note that the one path in the selector circuit 720 is a path connecting the output side of the nonvolatile memory circuit 702 and the input side of the volatile memory circuit 701.

In the driving method below, an example will be described where, in the case of using an n-channel transistor for the switch 703 and a p-channel transistor for the switch 704 in the structure illustrated in FIG. 7, the first terminal and the second terminal of the switch 703 are brought into conduction and the first terminal and the second terminal of the switch 704 are brought out of conduction when the control signal RD has a high-level potential, and the first terminal and the second terminal of the switch 703 are brought out of conduction and the first terminal and the second terminal of the switch 704 are brought into conduction when the control signal RD has a low-level potential. Further, in this example, a first terminal and a second terminal in one path in the selector circuit 720 are brought into conduction when the control signal SEL has a high-level potential, and the first terminal and the second terminal therein are brought out of conduction when the control signal SEL has a low-level potential. Furthermore, in the case of using an n-channel transistor for the transistor 709 in this example, the transistor 709 is turned on when the control signal WE has a high-level potential and the transistor 709 is turned off when the control signal WE has a low-level potential.

However, a driving method of the semiconductor device of one embodiment of the present invention is not limited to this, and in the following description, the potential of each control signal can be determined such that the switch 703, the switch 704, the selector circuit 720, and the transistor 709 are in the same state.

Figure 8:
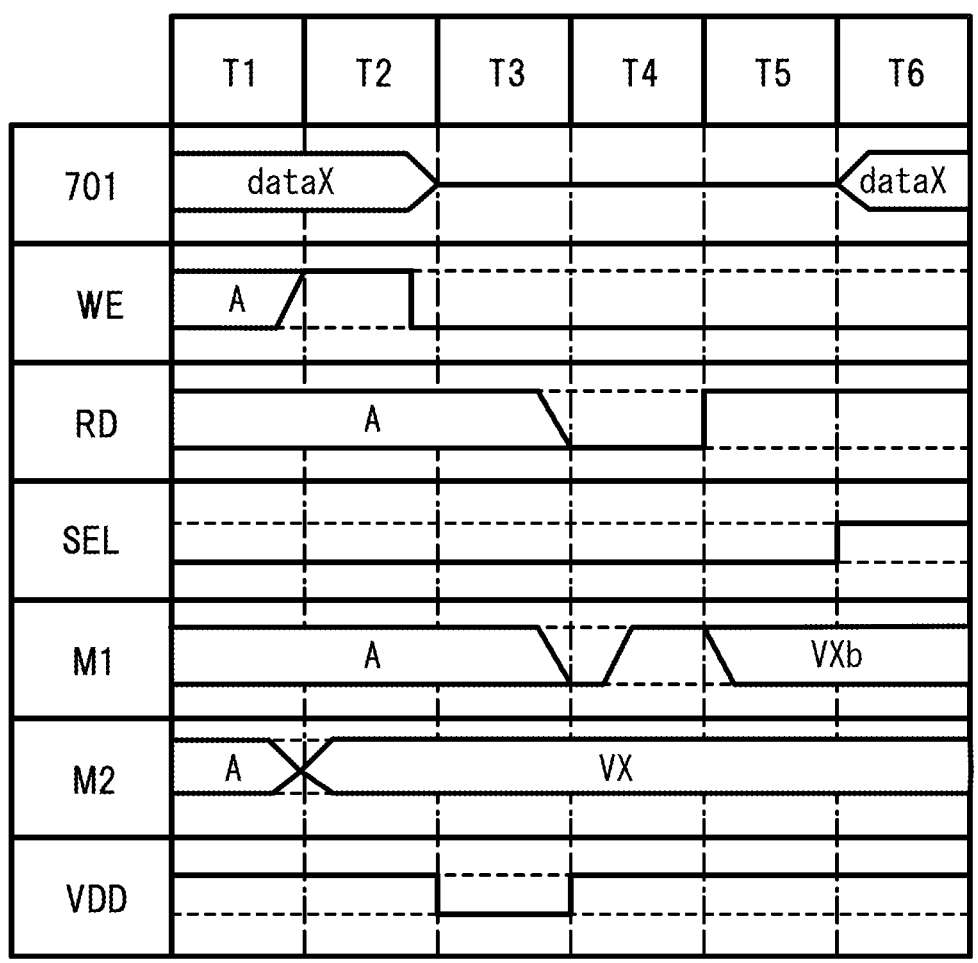
FIG. 8 is a timing chart showing operations of a memory device.

First, the operation in a period T1 in FIG. 8 will be described. In T1, the power supply voltage VDD is supplied to the memory element 700. In a period during which the power supply voltage is supplied to the memory element 700, data (referred to as dataX in FIG. 8) is held in the volatile memory circuit 701. At this time, the control signal SEL has a low-level potential so that the first terminal and the second terminal in the one path in the selector circuit 720 are out of conduction. Note that the first terminal and the second terminal of each of the switch 703 and the switch 704 may be in either the conduction state or the non-conduction state. That is, the control signal RD may have either a high-level potential or a low-level potential (referred to as A in FIG. 8). Further, the transistor 709 may be either on or off. That is, the control signal WE may have either a high-level potential or a low-level potential (referred to as A in FIG. 8). In T1, the node M1 may have any potential (referred to as A in FIG. 8). In T1, the node M2 may have any potential (referred to as A in FIG. 8). The operation in T1 is referred to as normal operation.

Next, the operation in a period T2 in FIG. 8 will be described. Before supply of the power supply voltage to the memory element 700 is stopped, the control signal WE is set to a high-level potential so that the transistor 709 is turned on. Thus, a signal corresponding to data (dataX) held in the volatile memory circuit 701 is input to the gate of the transistor 710 through the transistor 709. The signal input to the gate of the transistor 710 is held by the capacitor 708. In this manner, the potential of the node M2 becomes a signal potential (referred to as VX in FIG. 8) corresponding to the data held in the volatile memory circuit 701. After that, the control signal WE is set to a low-level potential so that the transistor 709 is turned off. Thus, a signal corresponding to the data held in the volatile memory circuit 701 is held in the nonvolatile memory circuit 702. Also in T2, the first terminal and the second terminal in the one path in the selector circuit 720 are kept in the non-conduction state owing to the control signal SEL. The first terminal and the second terminal of each of the switch 703 and the switch 704 may be in either the conduction state or the non-conduction state. That is, the control signal RD may have either a high-level potential or a low-level potential (referred to as A in FIG. 8). In T2, the node M1 may have any potential (referred to as A in FIG. 8). The operation in T2 is referred to as operation before stop of supply of the power supply voltage.

Next, the operation in a period T3 in FIG. 8 will be described. The operation before stop of supply of the power supply voltage is performed, and then, the supply of the power supply voltage to the memory element 700 is stopped at the beginning of T3. When the supply of the power supply voltage is stopped, the data (dataX) held in the volatile memory circuit 701 is lost. However, even after the supply of the power supply voltage to the memory element 700 is stopped, the signal potential (VX) corresponding to the data (dataX) held in the volatile memory circuit 701 is held in the node M2 by the capacitor 708. Here, as the transistor 709 in which the channel is formed in the oxide semiconductor layer, an n-channel enhancement (normally-off) transistor whose leakage current (off-state current) is extremely small is used. Therefore, since a ground potential (0 V) or a potential at which the transistor 709 is turned off continues to be input to the gate of the transistor 709 when supply of the power supply voltage to the memory element 700 is stopped, the transistor 709 can be kept in the off state even after the supply of the power supply voltage to the memory element 700 is stopped. As a result, a potential held by the capacitor 708 (the potential VX of the node M2) can be held for a long time. In this manner, even after the supply of the power supply voltage to the memory element 700 is stopped, data (dataX) is held. T3 corresponds to a period during which the supply of the power supply voltage to the memory element 700 is stopped.

Then, the operation in a period T4 in FIG. 8 will be described. After the supply of the power supply voltage to the memory element 700 is restarted, the control signal RD is set to a low-level potential; thus, the first terminal and the second terminal of the switch 704 are brought into conduction and the first terminal and the second terminal of the switch 703 are brought out of conduction. At this time, the control signal WE is a low-level potential, and the transistor 709 remains off. The control signal SEL is a low-level potential, and thus the first terminal and the second terminal in the one path in the selector circuit 720 are in the non-conduction state. In this manner, VDD is input to the second terminal of the switch 703 and the first terminal of the switch 704. Therefore, the second terminal of the switch 703 and the first terminal of the switch 704 (the potential of the node M1) can be set to a constant potential (here, VDD). The operation in T4 is referred to as pre-charge operation. The potential of the node M1 is held by the capacitor 707.

After the above pre-charge operation, in a period T5, the control signal RD is set to a high-level potential; thus, the first terminal and the second terminal of the switch 703 are brought into conduction and the first terminal and the second terminal of the switch 704 are brought out of conduction. At this time, the control signal WE is kept at a low-level potential, and the transistor 709 remains off. The control signal SEL has a low-level potential, and thus the first terminal and the second terminal in the one path in the selector circuit 720 are out of conduction. Depending on a signal held in the capacitor 708 (the potential VX of the node M2), the on/off state of the transistor 710 is selected, and the potential of the second terminal of the switch 703 and the first terminal of the switch 704, i.e., the potential of the node M1 is determined. In the case where the transistor 710 is on, the low power supply potential (e.g., GND) is input to the node M1. On the other hand, in the case where the transistor 710 is off, the potential of the node M1 is kept at a constant potential (e.g., VDD) which is determined by the above pre-charge operation. In this manner, depending on the on state or the off state of the transistor 710, the potential of the node M1 becomes VDD or GND. For example, in the case where a signal held in the volatile memory circuit 701 is "1" and corresponds to a high-level signal (VDD), the potential of the node M1 becomes a low-level potential (GND) corresponding to a signal "0". On the other hand, in the case where a signal held in the volatile memory circuit 701 is "0" and corresponds to a low-level potential (GND), the potential of the node M1 becomes a high-level potential (VDD) corresponding to a signal "1". That is, an inverted signal of a signal held in the volatile memory circuit 701 is held in the node M1. This potential is denoted as VXb in FIG. 8. That is, a signal corresponding to the data (dataX) input from the volatile memory circuit 701 in T2 is converted into the potential of the node M1 (VXb).

After that, in a period T6, the control signal SEL is set to a high-level potential, so that the first terminal and the second terminal in the one path in the selector circuit 720 are brought into conduction. At this time, the control signal RD is kept at a high-level potential. The control signal WE is kept at a low-level potential, and thus the transistor 709 remains off. Consequently, the phase of a signal corresponding to the potential of the second terminal of the switch 703 and the first terminal of the switch 704 (the potential of the node M1 (VXb)) is inverted through the logic element 706, and this inverted signal can be input to the volatile memory circuit 701. In this manner, the data which has been held before the stop of supplying the power supply voltage to the memory element 700 (dataX) can be held in the volatile memory circuit 701 again.

The potential of the node M1 is set to a constant potential (VDD in FIG. 8) by the pre-charge operation in T4, and becomes the potential VXb corresponding to the data (dataX) in T5. Since the pre-charge operation is performed, the time required for the potential of the node M1 to be set to the constant potential VXb can be shortened. In this manner, the time required for the volatile memory circuit 701 to hold original data again after the supply of the power supply voltage is restarted can be shortened.

The above is the driving method of the memory element.

In the driving method of the semiconductor device of one embodiment of the present invention, in a period during which the memory element 700 is not supplied with the power supply voltage, data stored in the volatile memory circuit 701 can be held by the capacitor 708 which is provided in the nonvolatile memory circuit 702.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the volatile memory circuit 701 to hold original data again after the supply of the power supply voltage is restarted can be shortened.

In the nonvolatile memory circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the nonvolatile memory circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory device can be returned to the same state as that before the power supply is stopped. Therefore, the power supply can be stopped even for a short time in the processor or one or a plurality of logic circuits included in the processor. Accordingly, power consumption can be suppressed.

This embodiment can be implemented in appropriate combination with any of the other embodiments.

Embodiment 3

In this embodiment, an example of a memory device that can be used for any of the nonvolatile memories described in Embodiments 1 and 2 and includes a transistor including an oxide semiconductor will be described with reference to drawings.

Figure 9A:
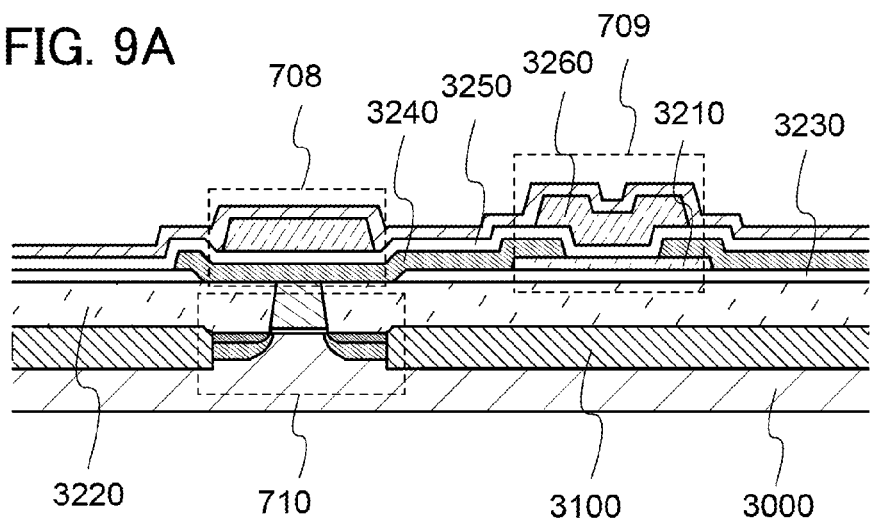
FIGS. 9A to 9C are cross-sectional views each illustrating a structure of a memory device.
Figure 9B:
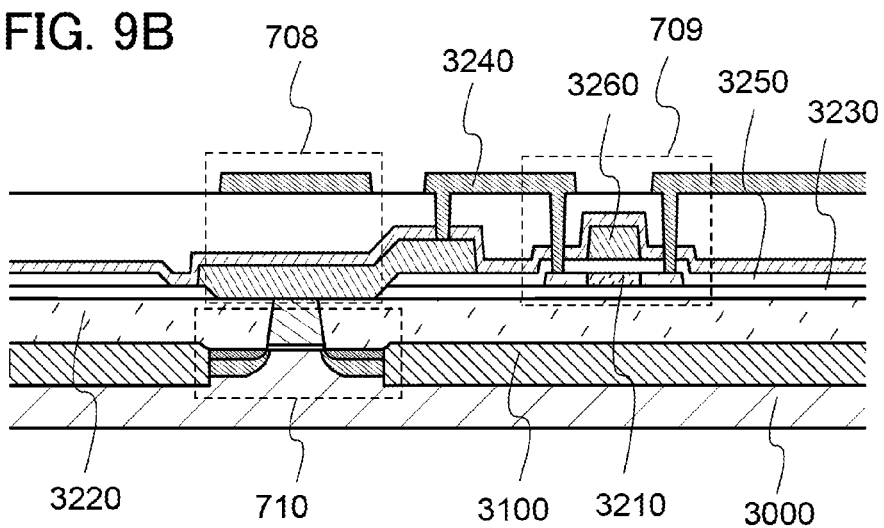
Figure 9C:
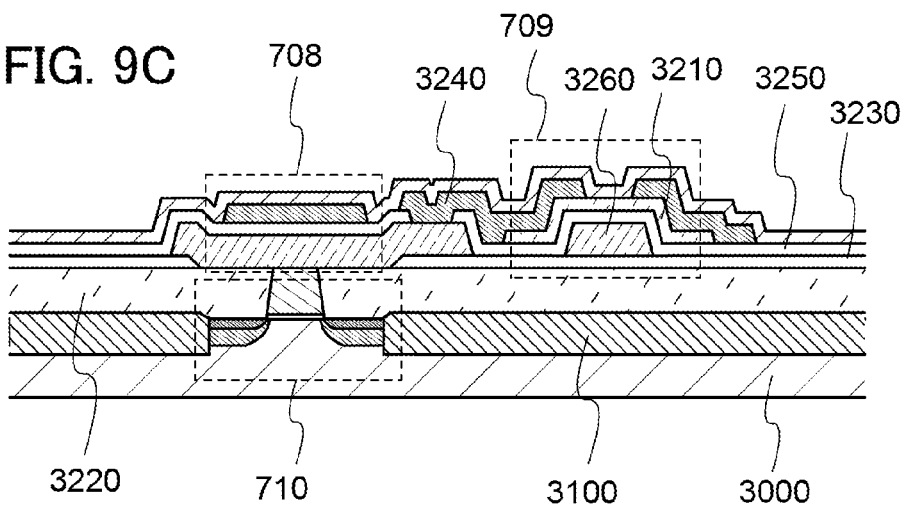

FIGS. 9A to 9C are each a cross-sectional view of an example of the nonvolatile memory circuit 702 in Embodiment 2.

The nonvolatile memory circuit 702 illustrated in FIG. 9A includes, in the lower portion, the transistor 710 in which a first semiconductor material (a substrate 3000) is used for a channel formation region, and includes, in the upper portion, the transistor 709 in which a second semiconductor material 3210 is used for a channel formation region and the capacitor 708. One electrode of the capacitor 708 is a layer that can be formed through the same steps as a gate electrode 3260 of the transistor 709, the other electrode thereof also functions as a source electrode or drain electrode 3240 of the transistor 709, and a dielectric thereof also functions as a gate insulating film 3250 of the transistor 709; thus, the capacitor 708 can be formed concurrently with the transistor 709.

Figure 10:
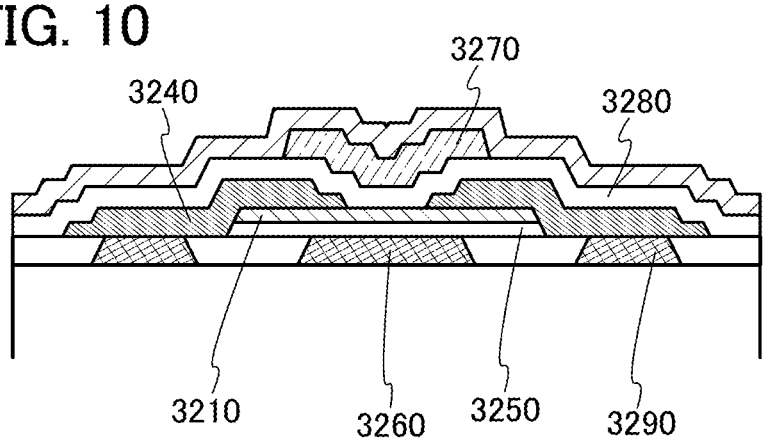
FIG. 10 is a cross-sectional view illustrating a structure of a transistor.

The transistor 709 is not limited to a top-gate transistor having a non-self-aligned structure in FIG. 9A, and may have a self-aligned structure illustrated in FIG. 9B and may be a bottom-gate transistor illustrated in FIG. 9C. In the case where a bottom-gate transistor is formed, a structure illustrated in FIG. 10 may also be used. In this structure, a source wiring or drain wiring 3290 can be formed using the layer that can be formed through the same steps as the gate electrode 3260; thus, the number of manufacturing steps can be reduced. Further, in the structure illustrated in FIG. 10, a second gate electrode 3270 is provided so as to overlap with the second semiconductor material 3210 with an insulating layer 3280 therebetween. With the second gate electrode 3270, the threshold voltage can be controlled. Note that in the structures illustrated in FIGS. 9A and 9B, a conductive layer functioning as a second gate electrode may be provided so as to overlap with the second semiconductor material 3210 with a base insulating layer 3230 therebetween.

In the capacitor 708, an insulating film serving as a planarization film may be used for the dielectric as illustrated in FIG. 9B.

Here, the first semiconductor material (the substrate 3000) and the second semiconductor material 3210 are preferably materials having different band gaps. For example, the first semiconductor material (the substrate 3000) may be a semiconductor material (such as silicon) other than an oxide semiconductor, and the second semiconductor material 3210 may be an oxide semiconductor. A transistor including a material other than an oxide semiconductor can operate at high speed easily. On the other hand, a transistor including an oxide semiconductor enables charge to be held in the nonvolatile memory circuit 702 for a long time owing to its characteristics.

Although both of the above transistors are n-channel transistors in the following description, it is needless to say that p-channel transistors can be used. The specific structure of the memory device, such as the material used for the memory device and the structure of the memory device, is not necessarily limited to those described here except for the use of the transistor, which is formed using an oxide semiconductor for holding data.

The transistor 710 in FIGS. 9A to 9C includes a channel formation region provided in the substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3100 is formed on the substrate 3000 so as to surround the transistor 710, and an insulating layer 3220 is formed so as to cover the transistor 710. Note that the element isolation insulating layer 3100 can be formed by an element isolation technique such as local oxidation of silicon (LOCOS) or shallow trench isolation (STI).

For example, the transistor 710 formed using a crystalline silicon substrate can operate at high speed. Thus, when the transistor is used as a reading transistor, data can be read at high speed. As treatment prior to formation of the transistor 709 and the capacitor 708, CMP treatment is performed on the insulating layer 3220 covering the transistor 710, whereby the insulating layer 3220 is planarized and, at the same time, an upper surface of the gate electrode layer of the transistor 710 is exposed.

The gate electrode layer of the transistor 710 is electrically connected to the one electrode of the capacitor 708, which is the extended source electrode or drain electrode of the transistor 709 over the insulating layer 3220.

The transistor 709 in FIGS. 9A to 9C is a transistor in which a channel is formed in an oxide semiconductor layer. Since the off-state current of the transistor 709 is small, stored data can be held for a long time owing to such a transistor. In other words, refresh operation becomes unnecessary or the frequency of the refresh operation in a semiconductor memory device can be extremely lowered, which leads to a sufficient reduction in power consumption.

The transistor 710 and the capacitor 708 can be formed so as to overlap with each other as illustrated in FIGS. 9A to 9C, whereby the area occupied by them can be reduced. Accordingly, the degree of integration of the memory device can be increased.

Embodiment 4

In this embodiment, a transistor with extremely small off-state current, which can be used for any of the nonvolatile memories described in Embodiments 1, 2, and 3, and a material for the transistor will be described.

As the transistor with extremely small off-state current, for example, a transistor in which a channel formation region includes a semiconductor having a wide band gap such as an oxide semiconductor is preferably used.

As one example of a semiconductor material which has a wider band gap than a silicon semiconductor and has a lower intrinsic carrier density than silicon, a compound semiconductor such as silicon carbide (SiC) or gallium nitride (GaN) can be given in addition to an oxide semiconductor. The oxide semiconductor has an advantage of high mass productivity because the oxide semiconductor can be formed by a sputtering method or a wet process, unlike silicon carbide or gallium nitride. Further, unlike silicon carbide or gallium nitride, the oxide semiconductor can be deposited even at room temperature; thus, deposition over a glass substrate or deposition over an integrated circuit using silicon is possible. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the performance of a transistor (e.g., field-effect mobility), the oxide semiconductor with crystallinity can be easily obtained by heat treatment at 250° C. to 800° C.

Note that a highly purified oxide semiconductor (purified OS) obtained by a reduction of impurities such as moisture or hydrogen which serves as an electron donor (donor) and by a reduction of oxygen vacancies is an i-type semiconductor or a substantially i-type semiconductor. Therefore, a transistor including the oxide semiconductor has a characteristic of extremely small off-state current. Furthermore, the band gap of the oxide semiconductor is 2 eV or more, preferably 2.5 eV or more, more preferably 3 eV or more. With the use of the oxide semiconductor film which has been highly purified by sufficiently reducing the concentration of impurities such as moisture and hydrogen and reducing oxygen vacancies, the off-state current of the transistor can be reduced.

It can be proved through various experiments that the off-state current of the transistor using the highly purified oxide semiconductor film for a channel formation region is small. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it can be found that an off-state current normalized by the channel width of the transistor is less than or equal to 100 zA/μm. In addition, a capacitor and a transistor were connected to each other and the off-state current was measured by using a circuit in which electric charge flowing into or from the capacitor was controlled by the transistor. In the measurement, a highly purified oxide semiconductor film was used for a channel formation region of the transistor, and an off-state current of the transistor was measured from a change in the amount of electric charge of the capacitor per unit time. As a result, it was found that in the case where the voltage between the source electrode and the drain electrode of the transistor was 3V, a smaller off-state current of several tens yoctoampere per micrometer (yA/μm) was able to be obtained. Consequently, the transistor whose channel formation region is formed in a highly purified oxide semiconductor film has much smaller off-state current than a transistor including crystalline silicon.

An oxide semiconductor preferably contains at least indium (In) or zinc (Zn). In particular, In and Zn are preferably contained. As a stabilizer for reducing a variation in electrical characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The oxide semiconductor may contain silicon.

Note that, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. The In—Ga—Zn-based oxide has sufficiently high resistance when there is no electric field and thus off-state current can be sufficiently reduced. In addition, also having high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio in the neighborhood of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the neighborhood of the above atomic ratios may be used.

However, the composition is not limited to those described above, and a material having an appropriate composition may be used depending on needed electric characteristics (such as mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

Note that the oxide semiconductor film can be formed by a sputtering method using a target containing indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the aforementioned atomic ratio, a polycrystal or CAAC is likely to be formed. The filling rate of the target containing In, Ga, and Zn is greater than or equal to 90%, preferably greater than or equal to 95%. With the use of such a target with a high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the rate of Zn within the above range.

In the case of forming a film of an In—Sn—Zn-based oxide semiconductor as an oxide semiconductor film by a sputtering method, it is preferable to use an In—Sn—Zn—O target having an atomic ratio of In:Sn:Zn=1:1:1, 2:1:3, 1:2:2, or 20:45:35.

Specifically, the oxide semiconductor film may be formed as follows: the substrate is held in the process chamber kept at reduced pressure, a sputtering gas from which hydrogen and moisture have been removed is introduced into the process chamber from which remaining moisture is being removed, and the above target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage by sputtering can be reduced. In order to remove remaining moisture in the process chamber, an entrapment vacuum pump is preferably used. For example, a cryopump, an ion pump, or a titanium sublimation pump is preferably used. The evacuation unit may be a turbo pump provided with a cold trap. In the process chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the process chamber can be reduced.

Note that, in some cases, the oxide semiconductor film formed by sputtering or the like contains a large amount of moisture or hydrogen (including a hydroxyl group) as impurities. Moisture and hydrogen easily form a donor level and thus serve as impurities in the oxide semiconductor. In order to reduce impurities such as moisture and hydrogen in the oxide semiconductor film (dehydrate or dehydrogenate the oxide semiconductor film), the oxide semiconductor film is subjected to heat treatment in a reduced-pressure atmosphere, an inert gas atmosphere of nitrogen, a rare gas, or the like, an oxygen gas atmosphere, or an ultra dry air (the air whose moisture amount is 20 ppm (−55° C. by conversion into a dew point) or less, preferably 1 ppm or less, more preferably 10 ppb or less, in the case where measurement is performed with a dew point meter in a cavity ring down laser spectroscopy (CRDS) method) atmosphere.

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

Note that in some cases, through the heat treatment, oxygen is released from the oxide semiconductor film and oxygen vacancies are formed in the oxide semiconductor film. In this case, it is preferable that treatment for supplying oxygen to the oxide semiconductor film be performed after the heat treatment so that oxygen vacancies are reduced.

For example, heat treatment performed in an atmosphere containing oxygen allows oxygen to be supplied to the oxide semiconductor film. Heat treatment for supplying oxygen may be performed under conditions similar to those of the above heat treatment for reducing the concentration of moisture or hydrogen. Note that the heat treatment for supplying oxygen is performed in an atmosphere containing oxygen, such as an oxygen gas or an ultra dry air atmosphere (the moisture content is lower than or equal to 20 ppm (−55° C. by conversion into a dew point), preferably lower than or equal to 1 ppm, more preferably lower than or equal to 10 ppb, in the measurement with the use of a dew point meter of a cavity ring down laser spectroscopy (CRDS) system).

It is preferable that in the gas containing oxygen, the concentration of water or hydrogen be low. Specifically, the concentration of impurities in the gas containing oxygen is lower than or equal to 1 ppm, preferably lower than or equal to 0.1 ppm.

Alternatively, as a method for supplying oxygen to the oxide semiconductor film, an ion implantation method, an ion doping method, a plasma immersion ion implantation method, plasma treatment, or the like can be used. If a crystal part included in the oxide semiconductor film is damaged after oxygen is supplied to the oxide semiconductor film, heat treatment can be performed so that the damaged crystal part is repaired.

An insulating film containing oxygen may be used as an insulating film, such as a gate insulating film, which is in contact with the oxide semiconductor film so that oxygen is supplied from the insulating film to the oxide semiconductor film. The insulating film containing oxygen is preferably made to contain oxygen in a proportion higher than that of the stoichiometric composition by heat treatment in an oxygen atmosphere, oxygen doping, or the like. Oxygen doping means addition of oxygen to a semiconductor film. In addition, oxygen doping includes oxygen plasma doping in which oxygen which is made to be plasma is added to a semiconductor film. The oxygen doping may be performed using an ion implantation method or an ion doping method. Through oxygen doping treatment, an insulating film which includes a region where the proportion of oxygen is higher than that of the stoichiometric composition can be formed. Then, heat treatment is performed after formation of the insulating film containing oxygen, so that oxygen is supplied from the insulating film to the oxide semiconductor film. With the above structure, oxygen vacancies serving as donors can be reduced in the oxide semiconductor film and the stoichiometric composition of the oxide semiconductor included in the oxide semiconductor film can be satisfied. As a result, the oxide semiconductor film can be made substantially i-type and variations in electric characteristics of the transistor due to oxygen vacancies can be reduced, which results in an improvement of electrical characteristics.

Note that the heat treatment for supplying oxygen from the insulating film to the oxide semiconductor film is performed in an atmosphere of nitrogen, ultra dry air, or a rare gas (e.g., argon or helium) preferably at a temperature higher than or equal to 200° C. and lower than or equal to 400° C., for example, a temperature higher than or equal to 250° C. and lower than or equal to 350° C. It is preferable that the water content in the gas be 20 ppm or less, preferably 1 ppm or less, further preferably 10 ppb or less.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

This embodiment can be implemented in appropriate combination with any of the other embodiments.

Embodiment 5

In this embodiment, the configuration of a CPU as an example of the processor in Embodiment 1 will be described.

Figure 11:
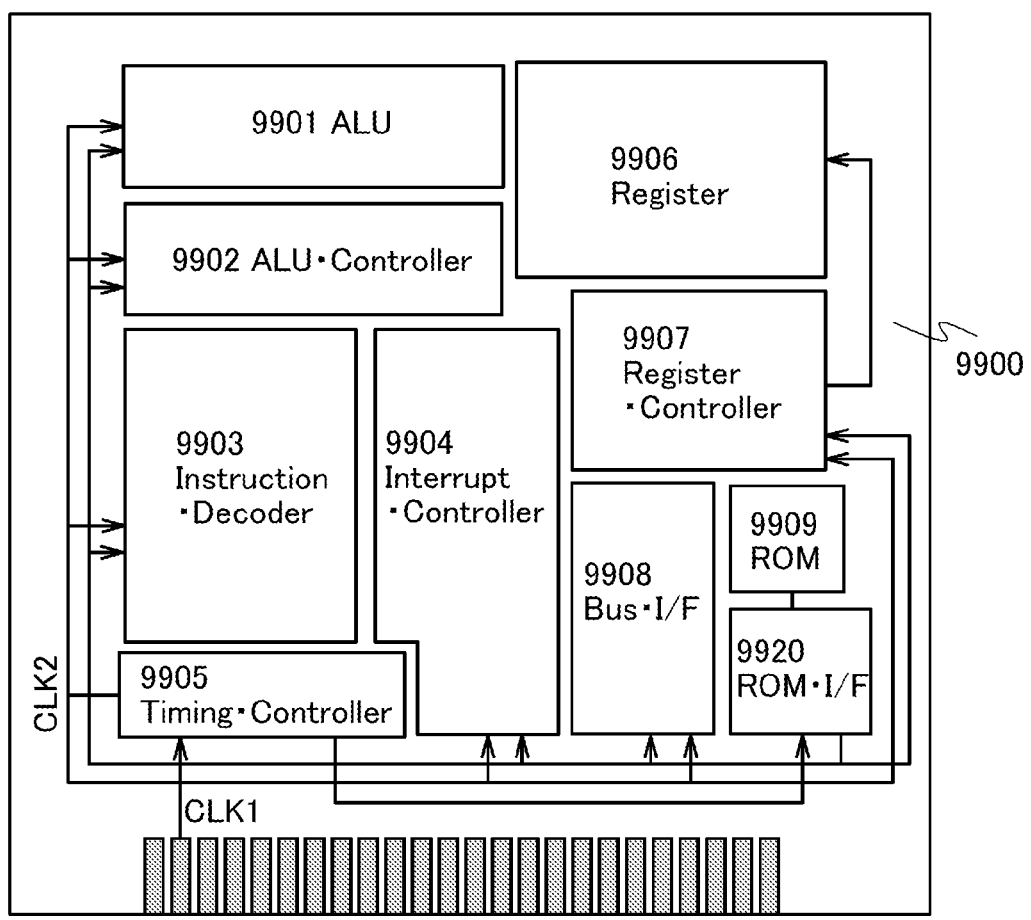
FIG. 11 is a block diagram of a CPU.

FIG. 11 illustrates a configuration of the CPU in this embodiment. The CPU illustrated in FIG. 11 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 11 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, a memory element having the structure described in Embodiment 2 is provided in the register 9906. The register controller 9907 determines, in response to an instruction from the ALU 9901 or the power gating circuit 140 described in Embodiment 1, whether data is held by the volatile memory circuit 701 or by the nonvolatile memory circuit 702 in the memory element in the register 9906.

When data holding by the volatile memory circuit 701 is selected, power supply voltage is supplied to the memory element in the register 9906. When data holding by the nonvolatile memory circuit 702 is selected, supply of power supply voltage to the memory element in the register 9906 can be stopped.

In such a manner, even in the case where the operation of the CPU is temporarily stopped and the supply of the power supply voltage is stopped, data can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing circuit of one embodiment of the present invention is not limited to the CPU and can be applied to an integrated circuit such as a microprocessor, an image processing circuit, a digital signal processor (DSP), or a field programmable gate array (FPGA).

This embodiment can be implemented in appropriate combination with any of the other embodiments.

Embodiment 6

A semiconductor device of one embodiment of the present invention can be used for display devices, personal computers, image reproducing devices provided with recording media, and the like. In addition, as electronic devices which can employ a semiconductor device of one embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic devices are illustrated in FIGS. 12A to 12F.

Figure 12A:
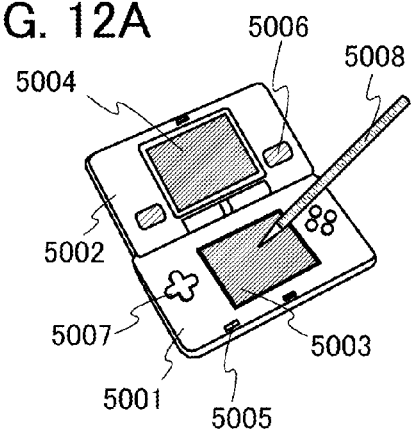
FIGS. 12A to 12F each illustrate an electronic device.

FIG. 12A illustrates a portable game console including a housing 5001, a housing 5002, a display portion 5003, a display portion 5004, a microphone 5005, a speaker 5006, an operation key 5007, a stylus 5008, and the like. Note that although the portable game console in FIG. 12A includes the two display portions 5003 and 5004, the number of display portions included in the portable game console is not limited to two.

Figure 12B:
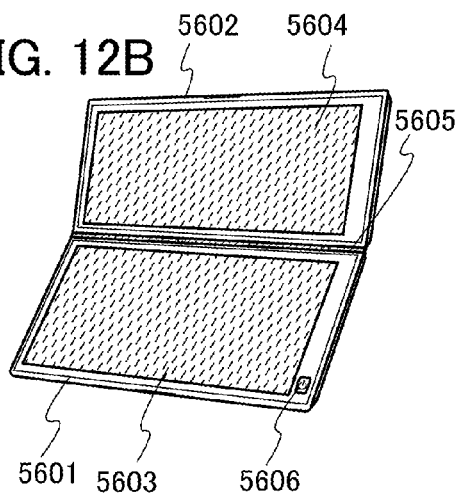

FIG. 12B illustrates a personal information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel area of a display device.

Figure 12C:
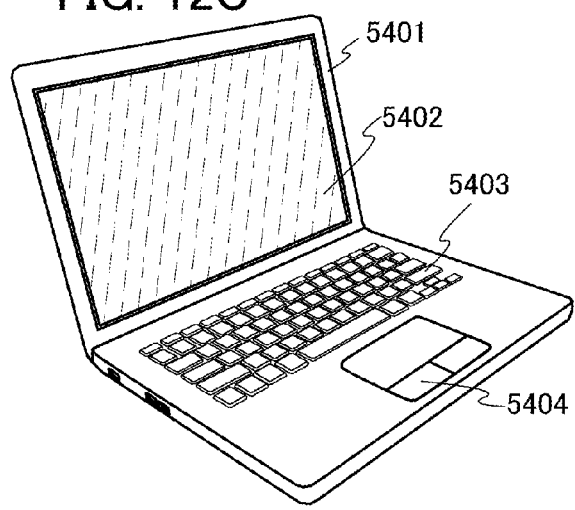

FIG. 12C illustrates a laptop including a housing 5401, a display portion 5402, a keyboard 5403, a pointing device 5404, and the like.

Figure 12D:
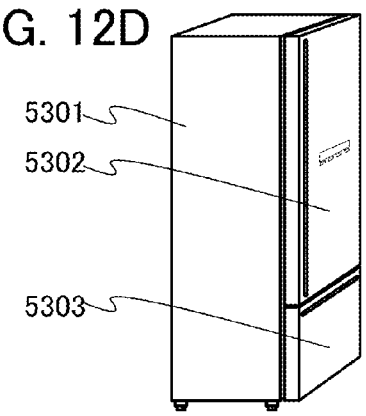

FIG. 12D illustrates an electric refrigerator-freezer including a housing 5301, a refrigerator door 5302, a freezer door 5303, and the like.

Figure 12E:
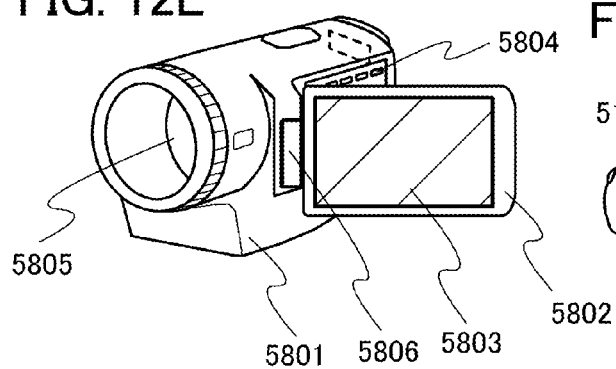

FIG. 12E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 12F:
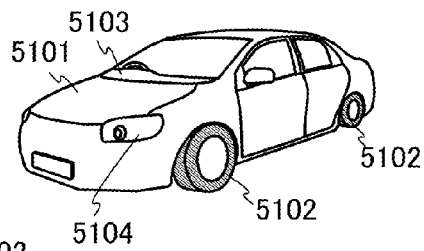

FIG. 12F illustrates a passenger car including a car body 5101, wheels 5102, a dashboard 5103, lights 5104, and the like.

In the above electronic devices, electronic control is actively performed by a processor or the like. According to one embodiment of the present invention, power consumption of an electronic device can be reduced.

This embodiment can be implemented in appropriate combination with any of the other embodiments.

This application is based on Japanese Patent Application serial no. 2012-119314 filed with Japan Patent Office on May 25, 2012, the entire contents of which are hereby incorporated by reference.

What is claimed is:

1. A semiconductor device comprising:
    a first circuit configured to control a state including a driving voltage and a clock frequency of a processor core;
    a first memory circuit and a second memory circuit which store state data;
    a second circuit generating a power supply voltage and a third circuit generating a clock, the second circuit and the third circuit being electrically connected to the first circuit; and
    the processor core electrically connected to the second circuit and the third circuit through a switch,
    wherein the processor cores comprises:
        a first memory; and
        a second memory transmitting and receiving data to/from the first memory; and
    wherein the first circuit reads state data stored in the first memory circuit and determines whether data in processing in the processor core is stored with a current state data when the first circuit receives an instruction for an off operation.

2. The semiconductor device according to claim 1, wherein state data including a driving voltage and a clock frequency supplied to the processor core is stored in the first memory circuit.

3. The semiconductor device according to claim 1, wherein state data including a driving voltage and a clock frequency supplied to the processor core before the first circuit receives an instruction for an off operation is stored in the second memory circuit.

4. The semiconductor device according to claim 1, wherein the first circuit, the switch, and the processor core are electrically connected to a power gating circuit.

5. The semiconductor device according to claim 1, comprising a plurality of the processor cores, a plurality of the first circuits, a plurality of the second circuits, and a plurality of the switches.

6. The semiconductor device according to claim 1, wherein the second memory comprises a transistor in which a channel formation region includes an oxide semiconductor.

7. A driving method of a semiconductor device, comprising the steps of:
    operating a processor core with a first state;
    performing an off operation; and
    performing an on operation,
    wherein the off operation comprises the steps of:
        keeping the first state or changing the first state into a second state;
        reading data from a first memory in the processor core;
        writing the data to a second memory in the processor core; and
        turning off the processor core, and
    wherein the on operation comprises the steps of:
        keeping a state in the off operation or changing the state in the off operation into a third state;
        turning on the processor core;
        reading the data from the second memory;
        writing the data to the first memory; and
        changing the state in the off operation or the third state into the first state.

8. The driving method of the semiconductor device, according to claim 7, wherein the off operation further comprises the step of determining whether the first state is kept or is changed into the second state.

9. The driving method of the semiconductor device, according to claim 7, wherein the on operation further comprising the step of determining whether the state in the off operation is kept or changed into the third state.

10. The driving method of the semiconductor device, according to claim 7, wherein the first state includes a driving voltage and a clock frequency supplied during an operation of the processor core before an instruction for the off operation is given.

11. The driving method of the semiconductor device, according to claim 7, wherein the second state includes a driving voltage and a clock frequency at which the data is normally written to the second memory in the processor core.

12. The driving method of the semiconductor device, according to claim 7, wherein the third state includes a driving voltage and a clock frequency at which the data is normally read from the second memory in the processor core.

13. A driving method of a semiconductor device, comprising the steps of:
storing first state data including a driving voltage and a clock frequency supplied to a processor core in a first memory device;
performing an off operation; and
performing an on operation,
wherein, in the off operation, a first circuit configured to control a state receives an instruction for the off operation, the first state data is stored in a second memory device, the first state data stored in the first memory device is rewritten into second state data, the driving voltage and the clock frequency of the processor core are changed in accordance with the second state data, the first circuit requests an instruction for the off operation from a power gating circuit, data stored in a first memory in the processor core is read, the data is written to a second memory in the processor core, and electrical connection between the processor core and each of a second circuit generating a power supply voltage and a third circuit generating a clock is broken.

14. The driving method of the semiconductor device, according to claim 13, wherein, in the on operation, the first circuit receives an instruction for the on operation, the second state data stored in the first memory device is rewritten into third state data, the driving voltage and the clock frequency of the processor core are changed in accordance with the third state data, the first circuit requests an instruction for the on operation from the power gating circuit, the processor core and each of the second circuit and the third circuit are reconnected, the data stored in the second memory is read, the data is written to the first memory, the third state data stored in the first memory device is rewritten into the first state data stored in the second memory device, and the driving voltage and the clock frequency of the processor core are changed in accordance with the first state data.

15. The driving method of the semiconductor device, according to claim 13,
wherein, in the on operation, the first circuit receives an instruction for the on operation, and the first circuit reads the first state data or the second state data stored in the first memory device and determines whether the data is normally read from the second memory in the processor core with the first state data or the second state data,
wherein, when the data is normally read from the second memory, the first circuit requests an instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data, and
wherein, when the data is not normally read from the second memory, the first state data or the second state data stored in the first memory device is rewritten into third state data, the driving voltage and the clock frequency of the processor core are changed in accordance with the third state data, the first circuit requests the instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data.

16. The driving method of the semiconductor device, according to claim 13, wherein the third state data includes data on a driving voltage and a clock frequency at which the data is normally read from the second memory in the processor core.

17. The driving method of the semiconductor device, according to claim 13, wherein, in the on operation, the first circuit receives an instruction for the on operation, the first circuit requests an instruction for the on operation from the power gating circuit, the processor core and each of the second circuit and the third circuit are reconnected, the data stored in the second memory is read, the data is written to the first memory, the state data stored in the first memory device is rewritten into the first state data stored in the second memory device, and the driving voltage and the clock frequency of the processor core are changed in accordance with the first state data.

18. The driving method of the semiconductor device, according to claim 13, wherein the first state data includes data on a driving voltage and a clock frequency supplied during an operation of the processor core before the first circuit receives the instruction for the off operation.

19. The driving method of the semiconductor device, according to claim 13, wherein the second state data includes data on a driving voltage and a clock frequency at which the data is normally written to the second memory in the processor core.

20. The driving method of the semiconductor device, according to claim 13, wherein, in the off operation or the on operation, the processor core is selected.

* * * * *